United States Patent [19]
Suzuki et al.

[11] Patent Number: 6,163,456
[45] Date of Patent: Dec. 19, 2000

[54] HYBRID MODULE AND METHODS FOR MANUFACTURING AND MOUNTING THEREOF

[75] Inventors: Kazutaka Suzuki; Naoto Narita; Tohru Watanabe; Yoshiaki Kamiyama; Kazuki Yagi, all of Tokyo, Japan

[73] Assignee: Taiyo Yuden, Co., Ltd., Tokyo, Japan

[21] Appl. No.: 09/239,669

[22] Filed: Jan. 29, 1999

[30] Foreign Application Priority Data

| Jan. 30, 1998 | [JP] | Japan | 10-019336 |
| Jan. 30, 1998 | [JP] | Japan | 10-019342 |
| Jan. 30, 1998 | [JP] | Japan | 10-019349 |
| Jan. 30, 1998 | [JP] | Japan | 10-019353 |

[51] Int. Cl.[7] .................................... H05K 7/20
[52] U.S. Cl. .................. 361/704; 361/702; 361/712; 361/736; 174/16.3; 257/707; 257/713; 257/722; 333/238
[58] Field of Search ............................ 361/704, 690, 361/697, 706, 709, 716–719, 712, 714, 736, 763, 683, 692, 790, 792; 333/238, 246; 257/706, 707, 714, 718, 719, 720, 723, 724, 777, 747, 796, 779, 735, 712, 713, 224, 778; 174/52.3, 261, 250, 252, 16.3; 165/80.2, 80.3, 185; 29/840, 827, 829, 593, 831, 832; 438/4, 15, 118, 119

[56] References Cited

U.S. PATENT DOCUMENTS

| 4,561,006 | 12/1985 | Currie | 357/28 |
| 4,875,087 | 10/1989 | Miyauchi et al. | 357/71 |
| 5,548,161 | 8/1996 | Hirano et al. | 257/722 |
| 5,572,405 | 11/1996 | Wilson et al. | |
| 5,831,825 | 11/1998 | Fromont | 361/719 |
| 5,952,719 | 9/1999 | Robinson et al. | 257/737 |

*Primary Examiner*—Leo P. Picard
*Assistant Examiner*—Michael Datskovsky
*Attorney, Agent, or Firm*—Lowe Hauptman Gopstein Gilman & Berner

[57] ABSTRACT

In a hybrid module which is mounted on a mother circuit board with a first surface of a substrate opposed to the mother circuit board, a cavity is formed on the first surface, and a heat-generating circuit component is facedown-bonded in the cavity. Heat generated in the circuit component is radiated to the mother circuit board through a heat radiation plate.

35 Claims, 6 Drawing Sheets

6,163,456

HYBRID MODULE AND METHODS FOR MANUFACTURING AND MOUNTING THEREOF

BACKGROUND OF THE INVENTION

1. Field of the Invention

The present invention relates to a hybrid module comprising circuitry constructed by integrating passive components, such as multilayer ceramic capacitors, and active components, such as semiconductor devices, on its substrate on which circuit patterns are formed.

2. Description of the Related Art

Conventional hybrid modules which has heat-generating components, such as field-effect transistors (FETs) and power semiconductor devices, on their substrate are known, including one which has a structure described below.

The hybrid module has chip-form electronic components, such as multilayer ceramic capacitors, and a heat-generating circuit component, such as a semiconductor device, including FETs, on the top surface of its substrate. The substrate is an aluminum-nitride-based ceramic substrate of good thermal conductivity. The chip-form electronic components are soldered to a land on the substrate. The circuit component is bonded to a land through solder bumps. Terminal electrodes of the hybrid module are formed on the sides of the substrate.

The hybrid module is mounted on a mother circuit board with its bottom, on which the circuit component is not formed, being opposed to the mother circuit board. When mounted, the terminal electrodes of the hybrid module are soldered to circuit patterns formed on the mother circuit board. An electrically conductive film formed on the mother circuit board is positioned between the substrate and mother circuit board. The electrically conductive film is made of material having good thermal conductivity so that heat generated in the hybrid module is efficiently transferred to the mother circuit board. In the hybrid module, heat generated by the components mounted on the substrate is transferred through the conductive film to the mother circuit board and radiated.

Thermal transfer in this hybrid module is inefficient because heat generated in the circuit component is transferred to the substrate through the solder bump of the circuit component, then to the mother circuit board through the conductive film. In addition, aluminum-nitride-based ceramics are expensive and uneconomical compared to common alumina-based substrate materials.

SUMMARY OF THE INVENTION

It is an object of the present invention to provide a hybrid module which achieves efficient heat radiation and lends itself to size reduction, and methods for manufacturing and mounting thereof.

To achieve the above object, the present invention proposes a hybrid module comprising a substrate and a heat-generating circuit component mounted on said substrate, said hybrid module being mounted on a mother circuit board with a first surface of said substrate, opposed to said mother circuit board, said hybrid module characterized in that a cavity is formed in said first surface of said substrate and said circuit component is facedown-bonded into said cavity.

According to the present invention, since the circuit component is facedown-bonded into the cavity formed in the first surface of the substrate, heat generated in the circuit component is transferred to the mother circuit board without passing through the substrate. Thus, the thermal conductivity of the hybrid module is improved to provide good heat radiation. Furthermore, the size of the hybrid module is reduced because the circuit component is mounted in the cavity.

Other objects, effects, and construction of the present invention will be apparent from the following detailed description.

DESCRIPTION OF THE PREFERRED EMBODIMENTS

Figure 1:
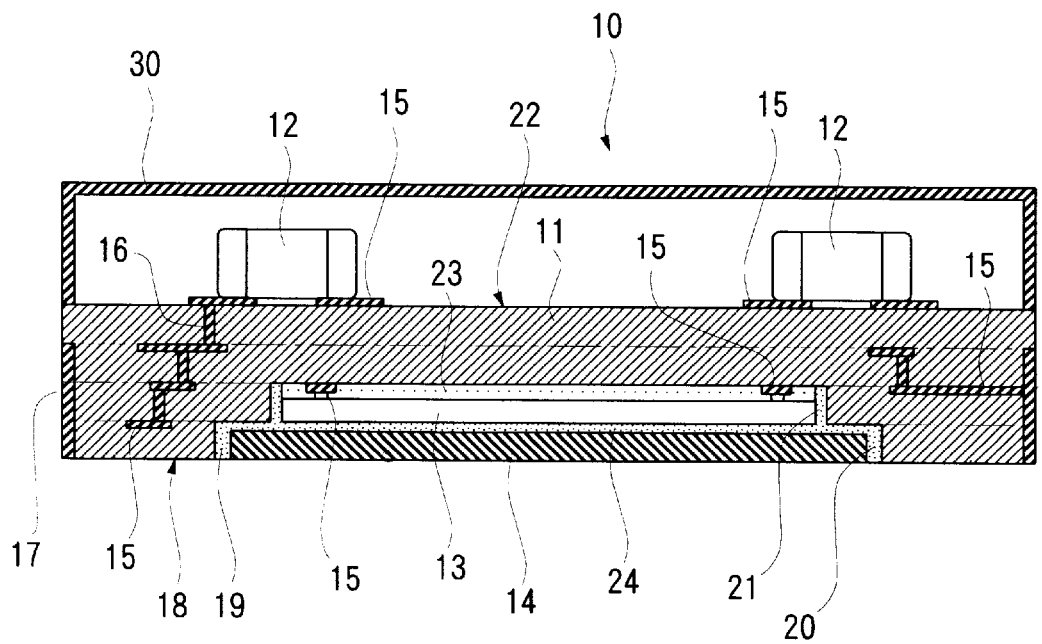
FIG. 1 is a cross-sectional view of a hybrid module.
Figure 2:
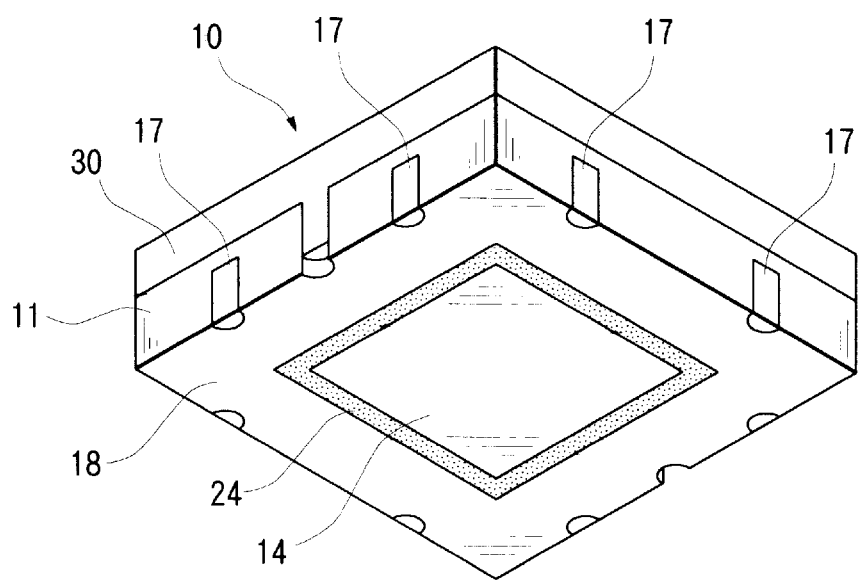
FIG. 2 is an exterior perspective view of the hybrid module viewed from under a first surface thereof.
Figure 3:
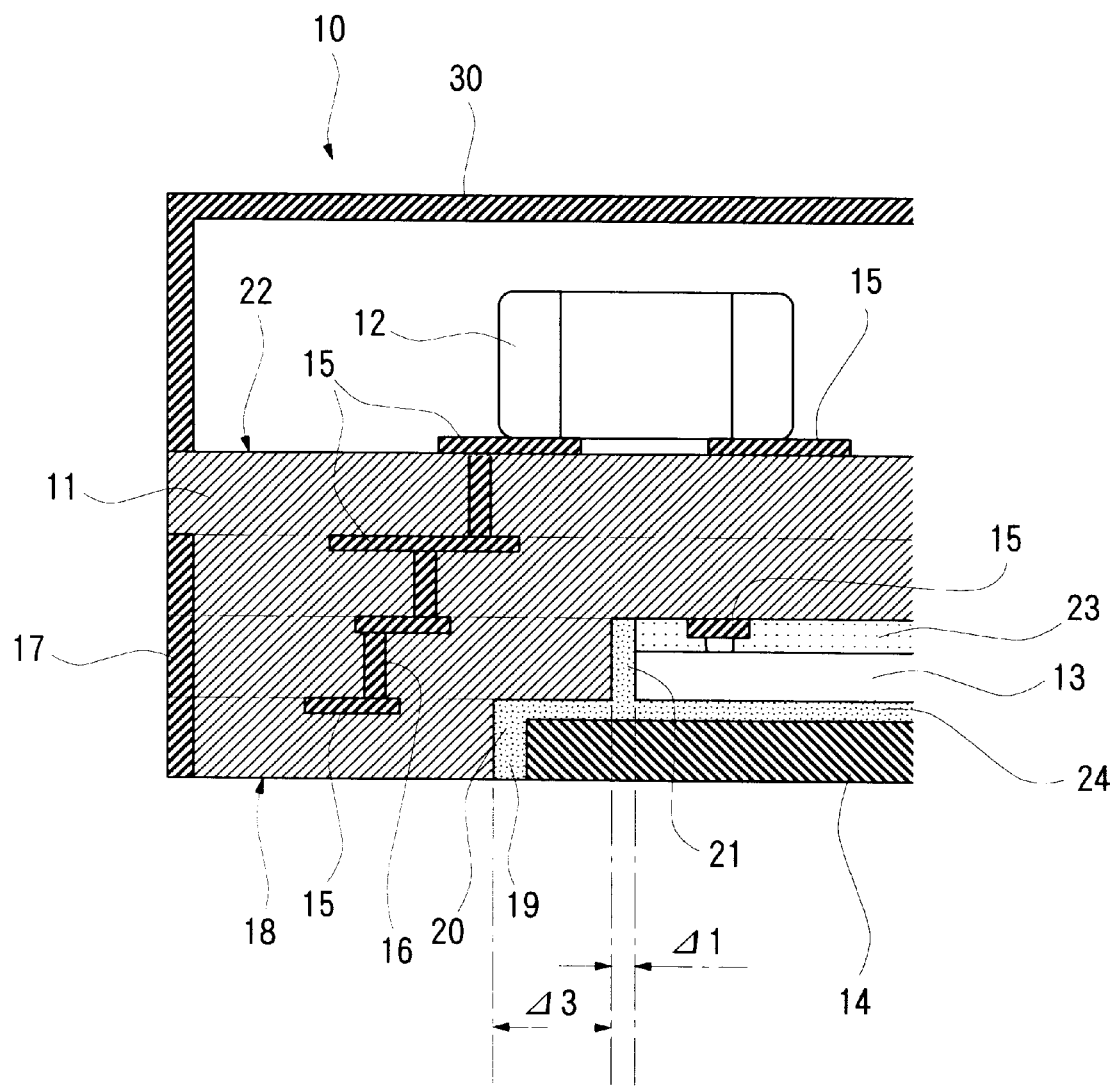
FIG. 3 is an enlarged view of a part of the hybrid module of FIG. 1.

A first embodiment of the present invention will be described with reference to FIGS. 1 to 3. FIG. 1 is a cross-sectional view of a hybrid module, FIG. 2 is an exterior perspective view of the hybrid module viewed from under its first surface, and FIG. 3 is an enlarged view showing a part of the hybrid module shown in FIG. 1.

The hybrid module 10 mainly comprises a substrate 11, a plurality of chip-form electronic components 12 mounted on the substrate 11, a heat-generating circuit component 13 such as a semiconductor device, and a heat radiation plate 14 for transferring heat generated in the circuit component 13 to a mother circuit board. The outer dimensions of the hybrid module 10 are, for example, approximately $7 \times 7 \times 2$ mm$^3$.

The substrate 11 is comprised of a multilayer substrate made of rectangular parallelepiped alumina-based ceramics. Specifically, it is comprised of a multilayer substrate made of ceramics made by blending PbO—$B_2O_3$—$SiO_2$ (borosilicate) with $Al_2O_3$ (alumina). The coefficient of linear expansion $\alpha 1$ of the substrate 11 is 5 ppm/°C. The coefficient of water absorption of the substrate 11 is 0.1% or less.

Circuit patterns 15 and via holes 16 are formed on the upper surface and internal layers of the substrate 11. Terminal electrodes 17 are formed on the side surfaces of the substrate 11 which connect to said circuit patterns 15. The terminal electrodes 17 are used to connect the substrate 11 to the mother circuit board when the substrate 11 is mounted on the mother circuit board. A cavity 19 is formed in the bottom surface of the substrate 11, that is, a first surface 18 which is opposed to the mother circuit board when mounted onto the mother circuit board. The cavity 19 receives the circuit component 13 and the heat radiation plate 14. The cavity 19 has a two-terraced structure. That is, the cavity 19 consists of a first cavity 20 formed in the first surface 18 and a somewhat smaller second cavity 21 formed in the bottom of the first cavity 20. On the bottom of the second cavity 21, the circuit patterns 15 connecting to the circuit component 13 are formed.

The chip-form electronic components 12 constitute the hybrid module. They include, for example, multilayer ceramic capacitors and laminated inductors. The chip-form electronic components 12 are mounted on the circuit patterns 15 formed on a second surface 22 opposite to the first surface 18.

The circuit component 13 is a heat-generating semiconductor device, for example, GaAsMES typed field-effect transistors (FFTs). As the circuit component 13, those components are used, which have a coefficient of linear expansion $\alpha 2$ that is approximately equal to 70 the coefficient of linear expansion $\alpha 1$ of the substrate 11 ($\alpha 1 \approx \alpha 2$). For example, components which have an $\alpha 2$ value of 6 ppm/°C.

The circuit component 13 is mounted on the bottom of the second cavity 21 by facedown-bonding. In this embodiment, flip-chip bonding is used. That is, the circuit component 13 is a flip chip having a plurality of terminal electrodes on the surface opposed to the bottom of the second cavity 21. Each of the terminal electrodes of the circuit component 13 is connected to the circuit pattern 15 formed on the second cavity 21. Regions of the gap between the circuit component 13 and the bottom of the second cavity 21, where the terminal electrodes of the circuit component 13 are not formed, is filled with sealing resin 23.

Major purposes of using sealing resin 23 are to prevent moisture from entering into the circuit component 13 and to fix the circuit component 13 to the substrate 11. Preferably, the sealing resin 23 has a linear expansion coefficient $\alpha 3$ which is approximately the same as the value of $\alpha 1$ and $\alpha 2$ of the substrate 11 and circuit component 13 ($\alpha 1 \approx \alpha 2 \approx \alpha 3$). In the present embodiment, epoxy-based resin is used as the sealing resin 23. The sealing resin 23 having a linear expansion coefficient approximately equal to that of the substrate 11 and circuit component 13 relieves stress caused by temperature variations during, for example, heat cycle test, to prevent delaminating of the resin 23. Thus, the poor electrical connection between the circuit component 13 and substrate 11, and a decrease in moisture resistance are prevented. Also the possibility of damage to the circuit component 13 which may be caused by the above mentioned delaminating is significantly reduced. Thus, the reliability of the hybrid module 10 is improved.

The following connections between the terminal electrodes of circuit component 13 and circuit patterns 15 may be used, for example: soldering connection, conductive resin connection, anisotropic conductive resin (ACF) connection, and connection by forming ball bumps containing gold (Au) on the circuit patterns 15 and then performing thermosonic bonding.

The connection made by conductive resins is advantageous in that it can be provided at lower cost. In addition, conductive resin provides high reliability because it absorbs stress. The connection made by anisotropic conductive resin eliminates the need of sealing resin, resulting in cost reduction.

The connection made by forming ball bumps on the circuit patterns 15 and performing thermosonic bonding reduces possibility of damage to the circuit component 13 which may be caused by plating, because the connection is made in dry processes. In addition, tooling cost is reduced and tire required for mounting the circuit component 13 on the substrate 11 is also reduced. That is, the mounting cost is reduced. Furthermore, the Au—Au junction provides reduced contact resistance, resulting in improved reliability.

The soldering connection does not require high mounting precision because positioning correction is provided by self-alignment. In addition, it provides reduced possibility of damage to circuit component 13 because the component is mounted under a low load. Furthermore, it provides high reliability because solder bumps absorb stress.

The heat radiation plate 14 is bonded to the circuit component 13 and the bottom of the first cavity 20 by a thermal-conductive resin 24. The heat radiation plate 14 is a plate having length and width enough to cover the opening of the second cavity 21 entirely and fit into the first cavity 20. The surface of the heat radiation plate 14 is positioned substantially coplanar with the first surface 18.

The heat radiation plate 14 is made of a material of high thermal conductivity. More particularly, it is made of a material having a linear expansion coefficient $\alpha 4$ which is approximately equal to the linear expansion coefficient $\alpha 2$ of the circuit component 13 ($\alpha 2 \approx \alpha 4$). For example, 42 alloy (composition of nickel and iron at a rate of 42:58, respectively) having a linear expansion coefficient $\alpha 4$ of 7 ppm/°C. may be used. The surface of the heat radiation plate 14 has a predetermined surface roughness (for example, average arithmetic roughness of 1.0 $\mu$m) provided by polishing. In addition, the surface of the heat radiation plate 14 is plated with, for example, Au, in order to improve solderbility.

The purpose of the thermal-conductive resin 24 is to fix the heat radiation plate 14 on the circuit component 13 and to effectively transfer heat generated in the circuit component 13 to the heat radiation plate 14. The thermal-conductive resin 24 bonds the circuit component 13 to the heat radiation plate 14 as described above. The gap between the sides of the heat radiation plate 14 and the sidewalls of the first cavity 20 and between the sides of the circuit component 13 and the second cavity 21 are filled with the thermal-conductive resin 24.

Preferably, the thermal-conductive resin 24 has a high coefficient of thermal conductivity. In addition, the thermal-conductive resin 24 preferably has a linear expansion coefficient $\alpha 5$ which is approximately equal to the value of $\alpha 2$ and $\alpha 4$ of the circuit component 13 and the heat radiation plate 14 ($\alpha 2 \approx \alpha 4 \approx \alpha 5$). The thermal-conductive resin 24 having a linear expansion coefficient approximately equal to that of the circuit component 13 and heat radiation plate 14 absorbs stress caused by temperature variations during, for example, heat cycle test to prevent the thermal-conductive resin 24 from being delaminated from the circuit component 13 and the heat radiation plate 14. This prevents an increase in the thermal resistance and a decrease in moisture resistance between the circuit component 13 and heat radiation plate 14. Also the possibility of damage to the mother circuit board 13 which may be caused by the above mentioned delaminating is significantly reduced. Thus, the reliability of the hybrid module 10 is improved.

A box-shaped metal casing 30 is provided to cover the upper surface of the hybrid module 10. The metal casing 30 protects components and the substrate 11 of the module 10 and prevents various types of noise from entering into the hybrid module 10 and emanating from the hybrid module 10.

The dimensions of the first cavity 20, the second cavity 21, and the heat radiation plate 14 of the hybrid module 10 are defined as follows:

First, the dimensions of the second cavity 21 will be described. The width and length of the second cavity 21 are defined such that a predetermined distance Δ1 between the sidewall of the second cavity 21 and the circuit component 13 is provided, as shown in FIG. 3. Here, the predetermined distance Δ1 is determined in such a way that the circuit component 13 is easily fitted in the second cavity 21 and easily positioned during mounting the circuit component 13 in the cavity. More particularly, it is desirable that the predetermined distance Δ1 be from 0.1 mm including to 1.0 mm including. The depth of the second cavity 21 is defined such that the depth of the second cavity 21 is a predetermined distance Δ2 smaller than the height from the bottom of the cavity 21 to the backside of the circuit component 13 when the circuit component 13 is mounted on the bottom of the cavity 21. Here, the predetermined distance Δ2 is determined in such a way that the thickness of the thermal-conductive resin 24 between the heat radiation plate 14 and circuit component 13 has a certain value. More specifically, it is desirable that the predetermined distance Δ2 be from 0 mm including to 0.2 mm including. This applies to an embodiment where a plurality of circuit components 13 is mounted in the second cavity 21. In the embodiment illustrated herein, the distance Δ2 is not shown because Δ2=0.

Now, the dimensions of the first cavity 20 will be described. The width and length of the first cavity 20 are defined such that a predetermined distance Δ3 between its sidewall and the edge of the second cavity 21 is provided. That is, the width and length of the opening of the first cavity 20 is a predetermined distance Δ3 greater than those of the opening of the second cavity 21. More particularly, it is desirable that the predetermined distance Δ3 be from 0.1 mm including to 0.5 mm including. The depth of the first cavity 20 is defined so as to be within a predetermined range with respect to the heat radiation plate 14. The predetermined range is determined so that the surface of the heat radiation plate 14 is substantially flush with the first surface 18. More specifically, it is desirable that the predetermined range be between −0.1 mm including and +0.1 mm including.

Now, a method for manufacturing the hybrid module will be described.

Figure 4:
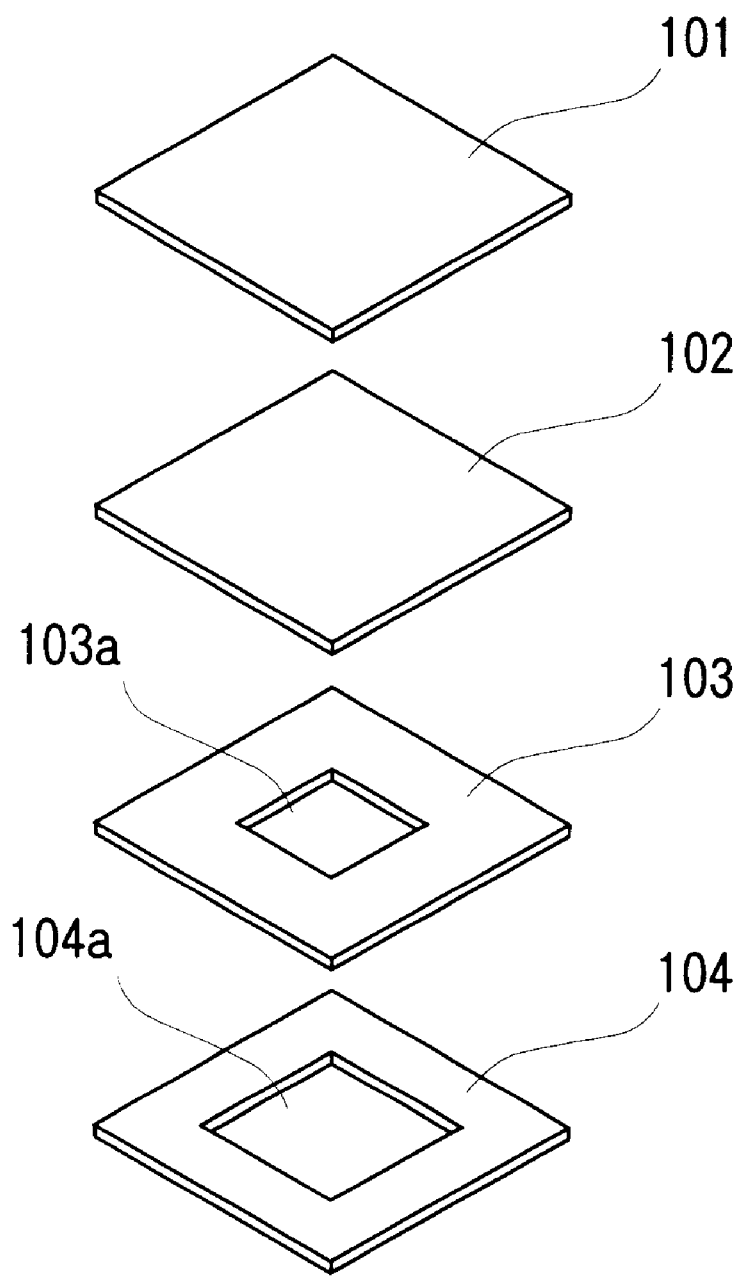
FIG. 4 shows a method for manufacturing a substrate.

First, alumina-based ceramic green sheets 101–104 are laminated as shown in FIG. 4, then the laminated sheets are bonded under pressure. Then, the resulting structure is baked to create the substrate 11.

Here, via holes and circuit patterns are formed in each of the green sheets 101–104. Using Cu or Ag for the circuit patterns will improve the heat radiation and high-frequency characteristics of the substrate 11.

On the bottom green sheet 104 an opening 104a whose shape corresponds to the first cavity 20 is formed. On the green sheet 103 stacked on the green sheet 104 an opening 103a whose shape corresponds to the second cavity 21 is ford. These openings are formed by perforating the green sheets with a punch.

Figure 5:
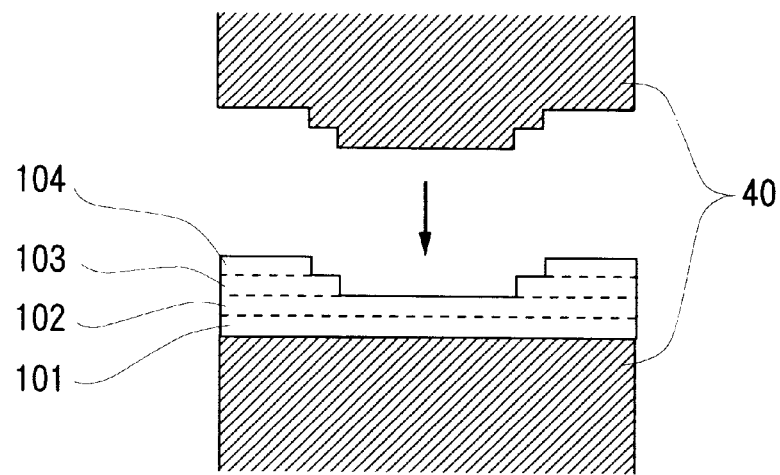
FIG. 5 shows a method for manufacturing the substrate.

A press 40 which fits into the cavity is used in bonding the green sheets 101–104, as shown in FIG. 5. Thereby, a uniform density of the entire substrate 11 is obtained. In addition, bumps can be easily formed inside the cavities because the surface roughness of inner surface of the cavities of the substrate 11 is reduced to approximately 10 μm or less.

Next, ball bumps are formed on the circuit patterns 15 formed on the bottom of the second cavity 21 of the substrate 11. The circuit component 13 is then connected to the ball bumps by a method such as thermosonic bonding. Then the gap between the circuit component 13 and the bottom of the second cavity 21 is filled with the sealing resin 23 by injecting it from a side of the circuit component 13 into the second cavity 21.

Next, the thermal-conductive resin 24 is injected into the surface of the circuit component 13. Thereafter, the heat radiation plate 14 is placed in the first cavity 20 and pressed in the direction of the circuit component 13 to bond to it. Thereby, the gaps at the side of the heat radiation plate 14 and the circuit component 13 are also filled with the thermal-conductive resin 24. The thermal-conductive resin 24 of constant thickness can be formed between the heat radiation plate 14 and the circuit component 13 because the end of the heat radiation plate 14 is restrained by the bottom end of the first cavity 20, that is, the stepped part of the cavity 19, during bonding.

Next, chip-formed electronic components 12 are soldered onto the second surface 22 of the substrate 11. Finally, the metal casing 30 is provided to cover the substrate 11 to complete the hybrid module 10.

Thus, uniform density is achieved over the entire substrate 11 by laminating a plurality of green sheets 101 to 104 to form the substrate 11 as a multilayer substrate and by laminating the green sheets 103 to 104 having openings 103a, 104a to form the cavity 19. otherwise, locally different density inside the substrate would be provided by laminating green sheets which have no opening, then forming the cavity by a method such as pressing. This ununiformity would cause a warp in the substrate due to variations in ambient humidity or temperature, resulting in disconnection of the circuit patterns or considerably lowered mounting quality of the circuit component. On the contrary, the substrate 11 fabricated as described above has uniform density over the entire region. Thus, the above mentioned defects are prevented.

Figure 6:
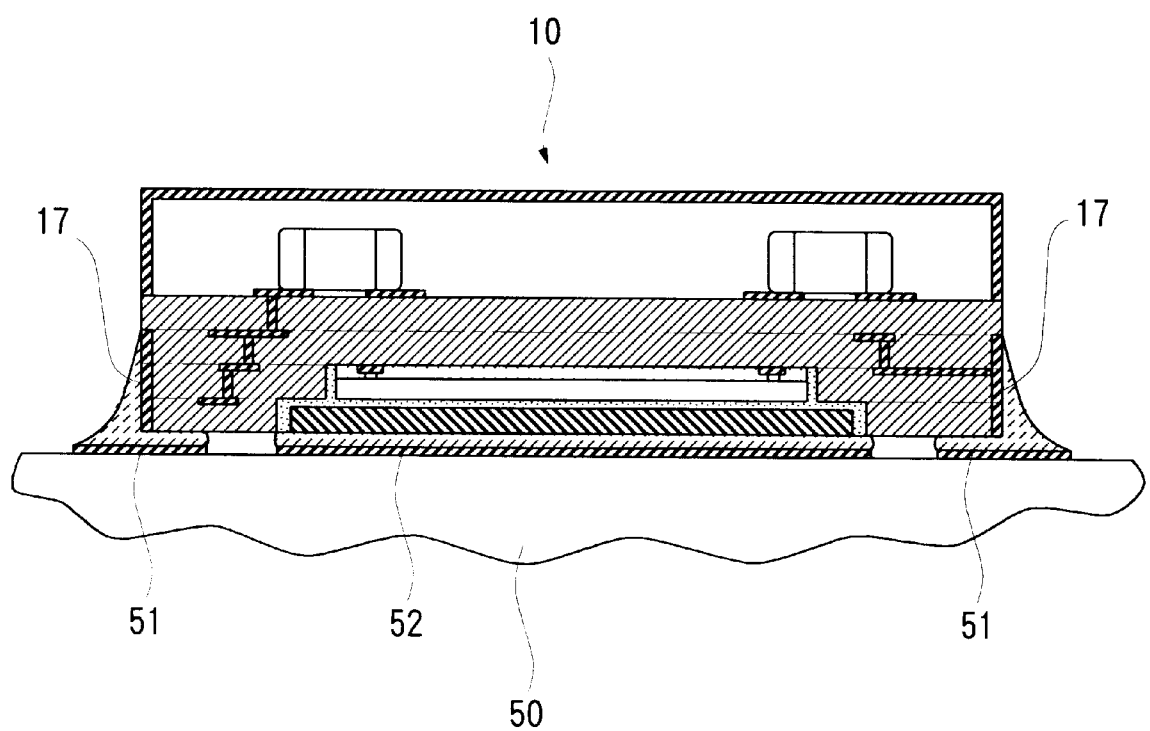
FIG. 6 is a cross-sectional view of the hybrid module mounted on a mother circuit board.

Now, a method for mounting the hybrid module 10 onto a mother circuit board 50. As shown in FIG. 6, circuit patterns 51 are formed on predetermined positions on the mother circuit board 50 for connecting to the terminal electrodes 17 of the hybrid module 10. A thermal-conductive film 52 is formed in a position opposed to the heat radiation plate 14 when the hybrid module 10 is mounted. The thermal-conductive film 52 is an electrically conductive film made of, for example, a copper-based material, and formed on the mother circuit board 50 similarly as the circuit patterns 51. To mount the hybrid module 10 on the mother circuit board 50, the terminal electrodes 17 are soldered to the circuit patterns 51 and the heat radiation plate 14 is soldered to the thermal-conductive film 52.

By providing solder joints not only for the terminal electrodes 17 but also for the heat radiation plate 14 of the hybrid module 10 as described above, heat generated in the circuit component 13 is efficiently transferred to the mother circuit board 50. In addition, because the heat radiation plate 14 is soldered to the thermal-conductive film 52, the adhesion strength between the hybrid module 10 and the mother circuit board 50 is improved. Connecting the thermal-conductive film 52 to a ground pattern in the mother circuit board 50 could provide stabilized electrical characteristics, especially in high-frequency region, and improved heat radiation. The heat radiation plate 14 and thermal-conductive film 52 does not necessarily require soldering. They may be only abutted on each other directly or through a thermal-conductive resin. Furthermore, the heat radiation plate 14 may be directly abutted on the surface of the mother circuit board 50 without the thermal-conductive film 52.

As described above in detail, heat generated by the circuit component 13 in the present hybrid module 10 is transferred from the surface of the circuit component 13 to the mother circuit board 50 through the thermal-conductive resin 24 and the heat radiation plate 14. Thus, the heat is radiated without passing through the substrate 11, resulting in improved heat radiation. In this case, the heat radiation plate 14 is bonded to the surface of the circuit component 13 through the thermal-conductive resin 24, therefore, heat generated by the circuit component 13 is efficiently transferred to the mother circuit board 50. Especially, because of a predetermined surface roughness of the heat radiation plate 14, it transfers heat efficiently. In addition, the plating applied to the heat radiation plate 14 improves the bonding strength between the thermal-conductive film 52 and the heat radiation plate 14. Thus, the heat transfer becomes more efficiently and the bonding strength is improved. The space in the second cavity which is not occupied by the circuit component 13 is also filled with the thermal-conductive resin 24, which improves the heat radiation further.

Because heat generated by the circuit component 13 is efficiently radiated from the hybrid module 10 without intervention of the substrate 11, the substrate 11 may be made of various materials without being restricted by their heat conductivity. Consequently, the hybrid module 10 can be manufactured at low cost.

In addition, the size of the hybrid module 10 can be minimized because the heat radiation plate 14 and the circuit component 13 is contained in the first and second cavities 20, 21 provided in the first surface 18.

The sizes of the first and second cavities 20, 21 are defined as described earlier. That is, the size of the second cavity 21 is determined with respect to the circuit component 13, therefore it is avoided that the second cavity is made larger than necessary and the area on the substrate 11 can be used efficiently. This allows the size reduction of the hybrid module 10. This also facilitates positioning of the circuit component 13 when mounted in the second cavity 21, and the component 13 can be mounted easily in it.

Because the depth of the second cavity 21 is also determined with respect to the size of the circuit component 13, a constant thickness of the thermal-conductive resin 24 between the circuit component 13 and the heat radiation plate 14 is assured. Thus, their thermal resistance is evened out.

Furthermore, because the size of the first cavity 20 is determined with respect to the second cavity 21, therefore it is avoided that the first cavity is made larger than necessary and the area on the substrate 11 can be used efficiently. This allows the size reduction of the hybrid module 10.

Because the depth of the first cavity 20 is determined with respect to the thickness of the heat radiation plate 14, the first surface 18 of the substrate 11 is substantially flush with the heat radiation plate 14. This means that the bottom surface of the hybrid module 10 becomes smooth. This facilitates mounting the hybrid module 10 onto the mother circuit board 50. Especially, the adhesion strength between heat radiation plate 14 and the thermal-conductive film 52 of the mother circuit board 50 is improved. The adhesion strength between the heat radiation plate 14 and the substrate 11 is improved because the heat radiation plate 14 is embedded in the substrate 11.

Stress caused by variations in temperature and humidity between the substrate 11 and the circuit component 13 is reduced because the substrate 11 is made of ceramics having a linear expansion coefficient equivalent to that of the circuit component 13. This prevents the circuit component 13 from being delaminated from the substrate 11 and assures high reliability.

Furthermore, because the linear expansion coefficient of the thermal-conductive resin 24 is approximately equal to those of the circuit component 13, the heat radiation plate 14, and the substrate 11; stresses occurring between the circuit component 13, the heat radiation plate 14 and the interior surface of the first cavity 20 is reduced. This prevents the heat radiation plate 14, the circuit component 13 and the substrate 11 from being delaminated each other under temperature variations during, for example, heat cycle test. This prevents an increase in the thermal resistance and a decrease in the adhesion strength, resulting in a stable heat radiation.

Stress on the circuit component 13 which is caused by temperature variations during, for example, heat cycle test is reduced; because the linear expansion coefficient of the sealing resin 23 is approximately equal to those of the circuit component 13 and substrate 11. This prevents poor junction between the substrate 11 and circuit component 13 caused by peeling-off the sealing resin 23, and destruction of the circuit component 13.

In the present embodiment, a material having a linear expansion coefficient α3 approximately equal to the linear expansion coefficients α1 and α2 of the substrate 11 and the circuit component 13 is used as the sealing resin 23. However, materials of a linear expansion coefficient α3 which is 20 ppm/°C. or less may be used to obtain substantially similar effect.

As the sealing resin 23, a resin may be used which has low viscosity of 2000 cps or less and contains fillers of 10 μm or less in diameter. In that case, the gap between the bottom surface of the second cavity 21 and the circuit component 13 can be easily filled with the sealing resin 23 during manufacturing, even if the gap is reduced by minizing the module.

Using a silicone-based resin of high moisture resistance as the sealing resin 23 enhances the prevention of moisture penetration into between the bottom surface of the second cavity 21 and the circuit component 13. This ensures the prevention of a short circuit between the terminal electrodes of the circuit component 13 due to moisture penetration. That is, the moisture resistance and reliability of the circuit component 13 are improved further.

Although a material having a linear expansion coefficient α5 which is approximately equal to the linear expansion coefficients α2 and α4 of the circuit component 13 and the heat radiation plate 14 is used as the thermal-conductive resin 24 in the present embodiment, materials of a linear expansion coefficient α5 of 30 ppm/°C. or less may be used. Furthermore, resins of a lower Young's modulus (elasticity), preferably 1000 kgf/mm$^2$ or less, may be used. The Young's modulus of the thermal-conductive resin 24 can be decreased by mixing insulating fillers such as $Al_2O_3$, AlN, BN or conductive fillers such as Ag and Cu into the resin. Mixing fillers into the thermal-conductive resin 24 increases its thermal conductivity and decreases its thermal resistance.

Resins which have a low viscosity of 5000 cps or less and contains fillers of 10 μm or less in diameter may be used as the thermal-conductive resin 24. This allows the thickness of the thermal-conductive resin 24 to be reduced, thereby minimizing the hybrid module 10. This also decreases the thermal resistance and increases heat radiation efficiency of the module 10.

In the present embodiment, a GaAs MES type FET is used as the circuit component 13 for high-frequency power amplification. This type of FET generates less heat because of the fast motion of the electrons in the device. The linear expansion coefficient of GaAs is 6 ppm/°C., which is greater than that of silicon (Si) and approaches the linear expansion coefficients of the substrate 11, heat radiation plate 14, and thermal-conductive resin 24, therefore stress caused by temperature variations is small. Thus, the FET is suitable for a device constituting the circuit component 13 of the hybrid module 10.

Other devices may be used instead of this GaAs MES type FET. For example, GaAs PHEMT type FETs or InP-based FETs may be used. Where a GaAs PHEMT type FET is used, heat generated by the device will be decreased further because the moving velocity of electrons in the device is faster than that in the MES FET. Where an InP-based FET is used, heat generated by the device will be decreased further because the moving velocity of electrons in the device is faster than that in the GaAs FET. In addition, the linear expansion coefficient of InP is 5 ppm/°C., which is greater than that of silicon (Si), therefore stress caused by temperature variations is reduced. Thus, this FET is suitable for a device constituting the circuit component 13 of the hybrid module 10.

Preferably, SiN or $SiO_2$ film, or a combination thereof is used as an insulation (passivation) film between the terminal electrodes of the circuit component 13. These films prevent deterioration of the device characteristics, even if the moisture resistance of the sealing resin is insufficient. These films also ensure the reliability of the device in case of moisture penetration that may be caused by a void in the sealing resin 23. In addition, these films ensure reliability of the device, even if a large number of residual ions are in the sealing resin 23, thereby providing the sealing resin 23 at a low cost.

Although the flip-chip mounting is used for the circuit component 13 in the present embodiment, the present invention is not limited to this method. For example, the beam lead method may be used for mounting the circuit component.

In the above description of the embodiment, hybrid module 10 including a single heat-generating circuit component 13 is described by way of example. However, a hybrid module containing a plurality of circuit components 13 may be implemented. In such a case, similar effects to the present embodiment can be achieved. If a plurality of heat-generating FETs is used, it is preferable that a circuit component having the plurality of FETs formed on a single GaAs die is used. This allows the mounting area to be reduced, compared with the case where the each of the plurality of FETs is individually mounted on the module, and the mounting cost to be reduced because the plurality of FETs is mounted at a time. In addition, this circuit component can easily be contacted with the heat radiation plate 14 or the mother circuit board 50, and even out the heat radiation, compared with the case where each of the plurality of FETs is mounted separately on the module.

Figure 7:
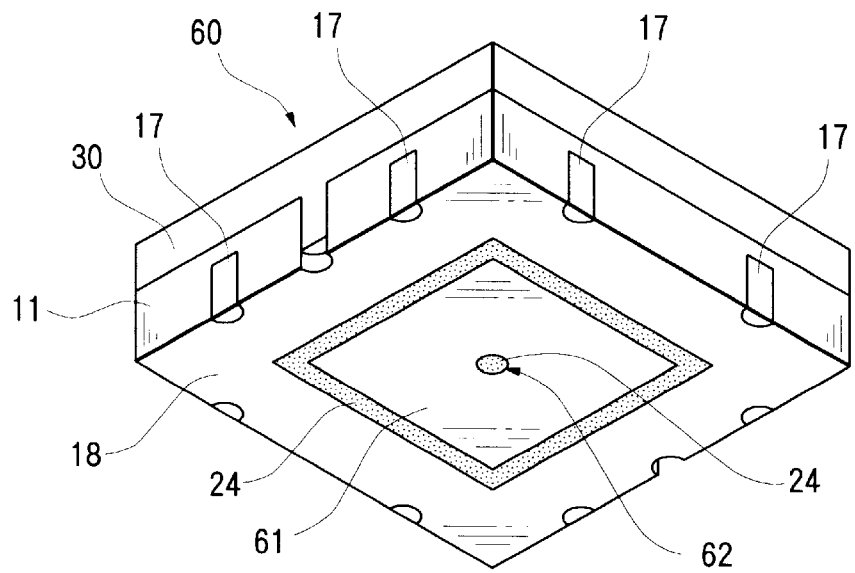
FIG. 7 is an exterior perspective view of a hybrid module according to another exemplary embodiment, viewed from under a first surface thereof.

The heat radiation plate 14 used in the present embodiment may be replaced with a heat radiation plate 61 shown in FIG. 7. FIG. 7 is an exterior perspective view of another exemplary hybrid module viewed from under a first surface. The heat radiation plate 61 has an adjustment hole 62 in its center. The adjustment hole 62 is used for adjusting the thickness of the thermal-conductive resin 24 between the heat radiation plate 61 and the circuit component 13. The adjustment hole 62 is filled with the thermal-conductive resin 24. When manufacturing the hybrid module 60, a somewhat larger injection amount of the thermal-conductive resin 24 than necessary amount is set to be injected during the injection process of the thermal-conductive resin 24. The adjustment hole 62 is filled with an excess amount of the thermal-conductive resin 24 when the heat radiation plate 61 is fitted into the first cavity 20 and pressed in the direction of the circuit component 13. If the amount of the thermal-conductive resin 24 is particularly large, the excess amount of the thermal-conductive resin 24 discharges through the adjusting hole 62. This means that the thickness of the thermal-conductive resin 24 between the heat radiation plate 61 and the circuit component 13 is evened out. The resin which overflowed through the hole 62 may be removed by using an appropriate method.

Figure 8:
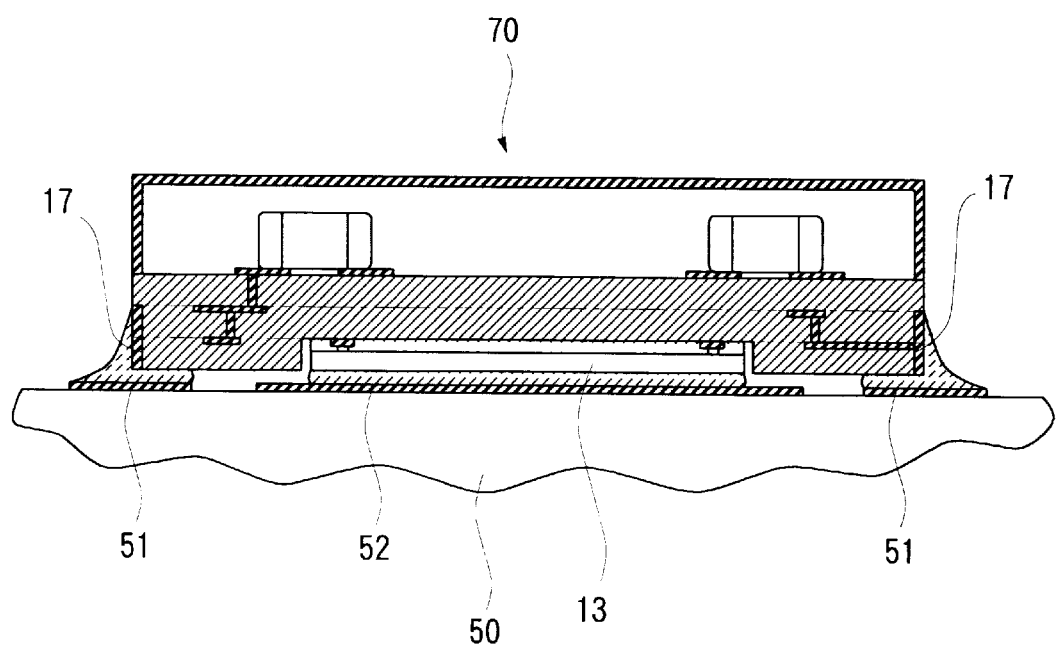
FIG. 8 is a cross-sectional view of a hybrid module according to another exemplary embodiment.

Although heat generated by the circuit component 13 is transferred to the mother circuit board 50 through the heat radiation plate 14 in the present embodiment, the heat radiation plate 14 may be omitted and the flip side of the circuit component 13 may be directly abut on or soldered to the conductive-film 52, as shown in FIG. 8.

Figure 9:
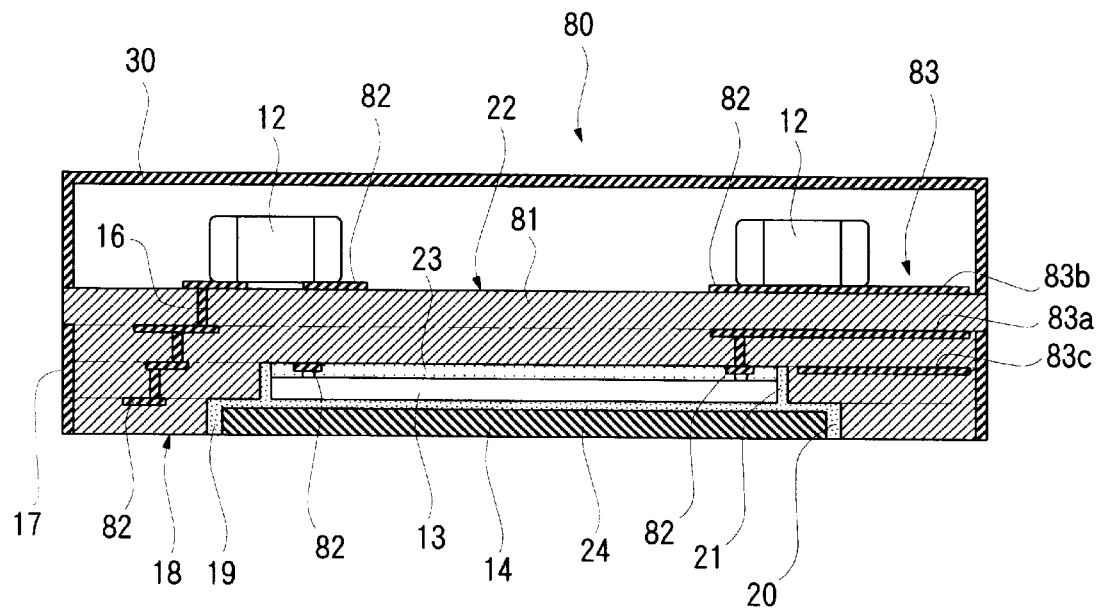
FIG. 9 is a cross-sectional view of a hybrid module according to another exemplary embodiment.

Now, a second embodiment of the present invention will be described with reference to the FIG. 9. FIG. 9 is a cross-sectional view of a hybrid module. In this figure, the same elements have the same references as in the first embodiment.

A hybrid module 80 differs from the hybrid module 10 of the first embodiment in circuit patterns formed on the respective substrates. The differences will be described below.

A substrate 81 of the hybrid module 80 is a multilayer substrate similar to the substrate 11 described above and has circuit patterns 82 formed in its top surface layer and internal layers. The substrate 81 has triplate strip lines 83 as the circuit patterns 82. The triplate strip lines 83 consist of a signal line 83a, and two ground lines 83b, 83c above and below the signal line 83a. The ground line 83c is formed in an internal layer of the substrate 81. The signal line 83a serves as a signal supply line to and a signal output line from the circuit component 13.

In such a hybrid module 80, the strip lines 83 are arranged as a triplate line in which at least one of the two ground lines 83b, 83c above and below the signal line 83a is formed in a internal layer of the substrate 81, therefore the volume of the substrate 81 can be used efficiently and the size of the module 80 can be reduced. Other effects and advantages of the second embodiment are similar to those of the first embodiment.

Figure 10:
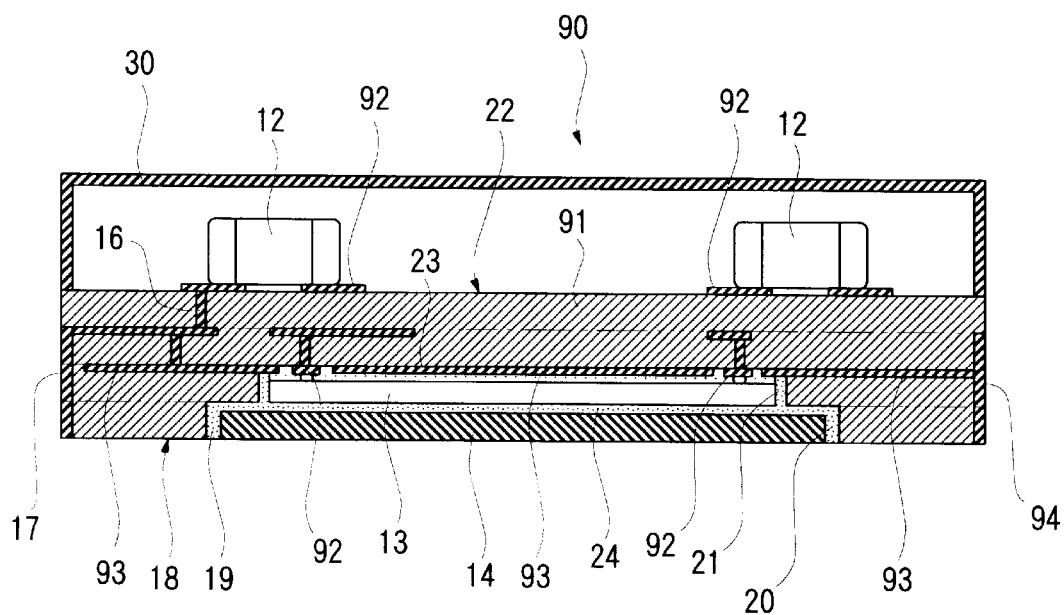
FIG. 10 is a cross-sectional view of a hybrid module according to another exemplary embodiment.

Now, a third embodiment of the present invention will be described with reference to FIG. 10. FIG. 10 shows a cross-sectional view of a hybrid module. In this figure, the same elements have the same references.

A hybrid module 90 differs from the hybrid module 10 of the first embodiment in circuit patterns formed on the respective substrates. The differences will be described below.

A substrate 91 of the hybrid module 90 is a multilayer substrate similar to the substrate 11 described above and has circuit patterns 92 formed in its top surface layer and internal layers. The circuit patterns 92 are also formed on the bottom surface of a second cavity 21 and a circuit component 13 is mounted onto these circuit patterns 92. In a layer of the substrate 91, in which the circuit component 13 is mounted, a ground conductor pattern 93 insulated from the circuit patterns 92 are formed in regions not occupied by the circuit patterns 92. The ground conductor pattern 93 connect to a terminal electrode 94 used as a ground.

This hybrid module 90 allows for improved isolation between chip-form electronic components 12 and the mother circuit board 50, and between the circuit patterns 92 mounted on the substrate 90 and the mother circuit board 50. Thus, the uniform hybrid module having good properties is provided. In addition, the shielding effect in the circuit component 13 could be improved further by connecting the heat-conductive film of the mother circuit board which joined with the heat radiation plate 14 to the ground when mounting the hybrid module on the mother circuit board. Other effects and advantages of the third embodiment are similar to those of the first embodiment.

The embodiments described herein are intended to illustrate the present invention by way of example, but not limit the scope of the invention. The scope of the invention is set forth in the accompanying claims and all variations which fall within the scope and spirits of the claims are intended to be contained in the present invention.

What is claimed is:

1. A hybrid module comprising
a substrate including a cavity on a first surface of said substrate,
a heat-generating circuit component mounted on said substrate,
said hybrid module being mounted on a mother circuit board with the first surface being opposed to said mother circuit board,
said circuit component being facedown-bonded in said cavity,
a layer of said substrate on which said circuit component is mounted having circuit patterns connected with terminal electrodes of said circuit component, and
regions of said layer which are not occupied by said circuit patterns being covered with a ground conductor pattern insulated from said circuit patterns.

2. A hybrid module comprising
a substrate including a cavity on a first surface of said substrate,
a heat-generating circuit component mounted on said substrate,
said hybrid module being mounted on a mother circuit board with the first surface being opposed to said mother circuit board,
said circuit component being facedown-bonded in said cavity,
said cavity on said substrate including a first cavity on said surface and a second cavity on the bottom surface of said first cavity,
said circuit component being facedown-bonded in said second cavity, and
a thermal-conductor element in said first cavity for transferring heat generated in said circuit component to said mother circuit board.

3. The hybrid module according to claim 4, wherein:
said substrate is a multilayer substrate including a plurality of laminated sheets of a predetermined thickness.

4. The hybrid module according to claim 3, wherein:
strip lines are formed in said substrate, and
at least one of said strip lines is a triplate strip line having at least one ground line forced in an internal layer of said substrate.

5. The hybrid module according to claim 2, wherein:
said thermal-conductor element includes a thermal-conductive heat transfer plate.

6. The hybrid module according to claim 2, wherein:
said thermal-conductor element includes a thermal-conductive heat transfer plate and a thermal-conductive resin for bonding said heat transfer plate to said circuit component.

7. The hybrid module according to claim 2, wherein:
the dimensions of said first cavity are such that a predetermined distance is between a sidewall of said first cavity and an edge of said second cavity.

8. The hybrid module according to claim 7, wherein:
said predetermined distance between the sidewall of said first cavity and the edge of said second cavity is in a range from 0.1 mm to 0.5 mm inclusive.

9. The hybrid module according to claim 5, wherein:
the depth of said first cavity is in a predetermined range with respect to the thickness of said heat radiation plate.

10. The hybrid module according to claim 9, wherein:
said predetermined range is from −0.1 mm to +0.1 mm inclusive.

11. The hybrid module according to claim 2, wherein:
the dimensions of said second cavity are such that a predetermined distance is between a sidewall of said second cavity and said circuit component.

12. The hybrid module according to claim 11, wherein:
said predetermined distance between the sidewall of said second cavity and said circuit component is in a range from 0.1 mm to 1.0 mm inclusive.

13. The hybrid module according to claim 2, wherein:
the depth of said second cavity is smaller by a predetermined value than, or equal to, the height of said circuit component from the bottom surface of said second cavity.

14. The hybrid module according to claim 13, wherein:
said predetermined value is greater than 0 mm and less than or equal to 0.2 mm.

15. The hybrid module according to claim 5, wherein:
said heat transfer plate is substantially flush with said first surface of said substrate.

16. The hybrid module according to claim 5, wherein:
the dimensions of said heat transfer plate are such that there is a predetermined distance between a sidewall of said first cavity and an edge of said heat radiation plate.

17. The hybrid module according to claim 16, wherein:
said predetermined distance is from 0.01 mm to 0.3 mm inclusive.

18. The hybrid module according to claim 6, wherein:
a gap between the sidewall of said second cavity and said circuit component is filled with said thermal-conductive resin.

19. The hybrid module according to claim 6, wherein:
a surface of said heat transfer plate which contacts said thermal-conductive resin has a predetermined surface roughness.

20. The hybrid module according to claim 5, wherein:
plating is applied to the surface of said heat transfer plate.

21. The hybrid module according to claim 6, wherein:
said substrate includes a ceramic substrate having a linear expansion coefficient equivalent to that of said circuit component.

22. The hybrid module according to claim 21, wherein:
said circuit component, said heat transfer plate, and said substrate all include elements having approximately the same linear expansion coefficient, and
said heat transfer plate and said circuit component as well as the internal surface of said first cavity are bonded together by a thermal-conductive resin having approximately the same linear expansion coefficient as those of said circuit component, said heat transfer plate, and said substrate.

23. The hybrid module according to claim 21, wherein:
said heat transfer plate and said circuit component as well as the internal surface of said first cavity are bonded together by a thermal-conductive resin containing fillers.

24. The hybrid module according to claim 21, wherein:
a space between the bottom surface of said second cavity of said substrate and said circuit component and not occupied by the electrically-conductive connections of said circuit component is filled with a resin having approximately the same linear expansion coefficient as those of said circuit component and said substrate.

25. The hybrid module according to claim 21, wherein:
a space between the bottom surface of said second cavity of said substrate and said circuit component and not occupied by the electrically-conductive connections of said circuit component is filled with a resin having a linear expansion coefficient of 20 ppm/°C. or less.

26. The hybrid module according to claim 21, wherein:
a space between the bottom surface of said second cavity of said substrate and said circuit component and not occupied by the electrically-conductive connections of said mother circuit board is filled with a moisture-resistant silicone-based resin.

27. A method of manufacturing a hybrid module including a substrate, a heat-generating circuit component mounted on said substrate, and a heat transfer plate for said circuit component, said method comprising:
fabricating said substrate having a first cavity and a second cavity formed on the bottom of said first cavity,
mounting said circuit component in said second cavity of said substrate,
injecting a thermal-conductive resin into said first cavity, and
fitting said heat transfer plate having an adjustment hole into said first cavity in which said thermal-conductive resin is injected.

28. A method of mounting a hybrid module onto a mother circuit board, said hybrid module including a substrate, a circuit component mounted on said substrate, a heat transfer plate for said circuit component, and a terminal electrode, said mounting method comprising:
bonding said terminal electrode with a conductor pattern formed on said mother circuit board, and
bonding said heat transfer plate with a thermal-conductive film formed on said mother circuit board.

29. A hybrid module for mounting on a mother circuit board, the hybrid module comprising a substrate including a cavity having a terraced structure on a first surface of said substrate, and a heat-generating circuit component mounted on said substrate, said hybrid module being arranged so that when it is mounted on the mother circuit board, the first surface is opposed to said mother circuit board, said circuit component being facedown-bonded in said cavity.

30. A hybrid module for mounting on a mother circuit board, the hybrid module comprising
a substrate including a cavity on a first surface of said substrate,
a heat-generating circuit component mounted on said substrate,
said hybrid module being arranged so that when it is mounted on the mother circuit board, the first surface is opposed to said mother circuit board, said circuit component being facedown-bonded in said cavity,
a layer of said substrate on which said circuit component is mounted having circuit patterns connected with terminal electrodes of said circuit component, and
regions of said layer which are not occupied by said circuit patterns being covered with a ground conductor pattern insulated from said circuit patterns.

31. A hybrid module for mounting on a mother circuit board, the hybrid module comprising
a substrate including a cavity on a first surface of said substrate,
a heat-generating circuit component mounted on said substrate,
said hybrid module being arranged so that when it is mounted on the mother circuit board, the first surface is opposed to said mother circuit board,
said circuit component being facedown-bonded in said cavity,
said cavity formed on said substrate including a first cavity on said surface and a second cavity on the bottom surface of said first cavity,
said circuit component being facedown-bonded in said second cavity, and
a thermal-conductor element in said first cavity for transferring heat generated in said circuit component to said mother circuit board.

32. A hybrid module for mounting on a mother circuit board, the hybrid module comprising
a substrate including a cavity on a first surface of said substrate,
a heat-generating circuit component mounted on said substrate,
said hybrid module being arranged so that when it is mounted on the mother circuit board, the first surface is opposed to said mother circuit board,
said circuit component being facedown-bonded in said cavity, and
an external electrode formed on a side surface of the substrate.

33. A hybrid module for mounting on a mother circuit board, the hybrid module comprising a substrate including a cavity on a first surface of said substrate, and a heat-generating circuit component mounted on said substrate, said hybrid module being arranged so that when it is mounted on the mother circuit board, the first surface is opposed to said mother circuit board, said circuit component being facedown-bonded in said cavity, and a thermal-conductor element in the cavity.

34. The hybrid module according to claim 2, wherein:
said substrate is a multilayer substrate including a plurality of laminated sheets having a predetermined thickness.

35. The hybrid module according to claim 34, wherein:
strip lines are formed in said substrate, and
at least one of said strip lines is a triplate strip line having at least one ground line formed in an internal layer of said substrate.

* * * * *